(12) United States Patent
Gotkis

(10) Patent No.: US 6,503,129 B1
(45) Date of Patent: Jan. 7, 2003

(54) ACTIVATED SLURRY CMP SYSTEM AND METHODS FOR IMPLEMENTING THE SAME

(75) Inventor: Yehiel Gotkis, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/684,765

(22) Filed: Oct. 6, 2000

(51) Int. Cl.[7] .............................................. B24B 57/04
(52) U.S. Cl. ................. 451/60; 451/6; 451/7; 451/53; 451/446
(58) Field of Search ................. 451/60, 53, 7, 451/6, 446; 210/739; 385/128; 438/693

(56) References Cited

U.S. PATENT DOCUMENTS

| | | | |
|---|---|---|---|
| 5,811,355 A | | 9/1998 | Jordan .................... 438/692 |
| 5,922,620 A | * | 7/1999 | Shimomura et al. ........ 438/693 |
| 5,957,750 A | * | 9/1999 | Brunelli .................... 451/7 |
| 6,012,967 A | * | 1/2000 | Satake et al. .............. 451/36 |
| 6,116,991 A | | 9/2000 | Liu et al. .................. 451/285 |
| 6,121,144 A | * | 9/2000 | Marcyk et al. ............. 438/692 |
| 6,183,351 B1 | * | 2/2001 | Aoki ....................... 451/60 |
| 6,227,939 B1 | * | 5/2001 | Monroe ..................... 451/7 |
| 6,257,955 B1 | * | 7/2001 | Springer et al. ............ 451/7 |
| 6,315,635 B1 | * | 11/2001 | Lin ......................... 451/7 |

FOREIGN PATENT DOCUMENTS

| | | | |
|---|---|---|---|
| EP | 2000015557 | 1/2000 | ............ B24B/37/00 |
| WO | WO 98/35785 | 8/1998 | ............ B24B/37/04 |
| WO | WO 99/61540 | 12/1999 | ............ C09G/1/02 |

* cited by examiner

Primary Examiner—George Nguyen
(74) Attorney, Agent, or Firm—Martine & Penilla, LLP

(57) ABSTRACT

A method for enhancing the material removal rate of an upper layer of a wafer in chemical mechanical planarization (CMP) systems is provided. The method includes applying radiation to an amount of slurry before the slurry is applied to the upper layer of the wafer. In one example, the method also includes providing a polishing pad and a carrier head configured to hold the wafer. The method further includes creating a mechanical polishing interface between the polishing pad, the upper layer of the wafer, and the radiation exposed slurry by bringing the polishing pad and the carrier head into contact.

14 Claims, 8 Drawing Sheets

$M_{layer}$ + oxidizing agent + dissolving agent(s) → $M_{dissolved}$ + by-products

Equation 1

$$M_{(s)} + \text{oxidizing agent} \xrightarrow{R_{ox}} \text{M-oxide(s)} + \text{dissolving agent(s)} \xrightarrow{R_{dis}} M_{dis} + \text{by-products}$$

Equation 2

Slow oxide formation - $R_{ox} \ll R_{dis}$
Fast oxide formation - $R_{ox} \gg R_{dis}$

Equation 3

FIG. 2A

ACTIVATED SLURRY CMP SYSTEM AND METHODS FOR IMPLEMENTING THE SAME

BACKGROUND OF THE INVENTION

1. Field of the Invention

The present invention relates generally to chemical mechanical planarization (CMP) systems and techniques for improving the performance and effectiveness of CMP operations. Specifically, the present invention relates to enhancing the performance of metal CMP systems.

2. Description of the Related Art

In the fabrication of semiconductor devices, there is a need to perform CMP operations, including planarization, buffing and wafer cleaning. Typically, integrated circuit devices are in the form of multi-level structures. At the substrate level, transistor devices having diffusion regions are formed. In subsequent levels, interconnect metallization lines are patterned and electrically connected to the transistor devices to define the desired functional device. As is well known, patterned conductive layers are insulated from other conductive layers by dielectric materials, such as silicon dioxide. As more metallization levels and associated dielectric layers are formed, the need to planarize the dielectric material increases. Without planarization, fabrication of additional metallization layers becomes substantially more difficult due to the higher variations in the surface topography. In some other applications, metallization line patterns are formed in the dielectric material, and then metal CMP operations are performed to remove excess metallization. Copper (Cu) CMP became a Cu Dual Damascene technology enabling operation as none of the other technologies are capable of shaping the copper plugs and wires.

CMP systems typically implement rotary, belt, orbital, or brush stations in which belts, pads, or brushes are used to scrub, buff, and polish one or both sides of a wafer. Normally, the removal of excess dielectric and metallization layers is achieved through in situ chemical modification of the processed wafer surface thus making the wafer surface more pliable for material removal. Slurry is used to facilitate and enhance the chemical modification of the CMP operation. Slurry is most usually introduced onto a moving preparation surface, e.g., pad, and distributed over the preparation surface as well as the surface of the semiconductor wafer being buffed, polished, or otherwise prepared by the CMP process. The slurry distribution is generally accomplished by a combination of the movement of the preparation surface, the movement of the semiconductor wafer and the friction created between the semiconductor wafer and the preparation surface. Subsequently, the chemically modified excess metallization and dielectric layers are removed from the surface of the wafer. As the metallization and dielectric layers each have different chemical characteristics, the chemical mechanical planarization operation of the metallization layers defer from chemical mechanical planarization operation of dielectric layers. The following is a brief description of both CMP operations.

The chemical mechanical planarization operation of dielectric layers are achieved by dissolving the dielectric layer (i.e., the oxide layer) in hot water under pressure so as to create loose polyhydrosilicates. Thereafter, the polyhydrosilicates can be removed from the wafer surface easily. In contrast, the chemical mechanical planarization operation of metallization layers poses a significant challenge, as the ductile characteristic of metals renders excess metallization layer removal almost impossible. In contrast to non-metal elements in which electrons are localized between the atoms, the valence electrons of metal elements are not localized between a pair of atoms and create a "conductivity zone," "electron cloud," or "electron layer." As a result, the free metal ions are attracted to the electron layer. Thus, the resulting metal atoms can be easily moved along the surface of the metallization layer without causing the bond between them and the electron cloud to break. Frequently, this is related to the "ductile" nature of metals, which herein is referred to as the ability of the attached resulting metal atoms to easily move from their respective equilibrium positions on the surface of the metallization layer without breaking the metallic bond between them and the surface of the metallization layer. As a comparison, in nonmetal elements having localized electrons, normally, the molecular bonding can be easily broken by simply changing the angles of the atoms by 20% to 30%.

As such, to perform CMP operation on the metallization layers, the metallization layers must be converted into chemical compounds having molecular bonding (e.g., oxides, etc.). In another word, the metallic bonding between the resulting metal atoms and the metallization layer must be changed into a form of molecular bonding wherein electrons are localized between two specific atoms. Thus, in metal CMP operations, metallization layers are oxidized, thereby creating oxidized layers. As the oxide molecules have molecular bonding, the oxidized layers can be easily removed mechanically.

An exemplary prior art CMP system 100 is shown in FIG. 1. The CMP system 100 of FIG. 1 is a belt-type system, so designated because the preparation surface is an endless polishing pad 108 mounted on two drums 114 which drive the polishing pad 108 in a rotational motion as indicated by polishing pad rotation directional arrows 116. A wafer 102 is mounted on a carrier 104. The carrier 104 is rotated in direction 106. The rotating wafer 102 is then applied against the rotating polishing pad 108 with a force F to accomplish a CMP process. Some CMP processes require significant force F to be applied. A platen 112 is provided to stabilize the polishing pad 108 and to provide a solid surface onto which to apply the wafer 102. Depending on the type of excess material being removed, a slurry 118 including of an aqueous solution such as $NH_4OH$ or DI water containing dispersed abrasive particles is introduced upstream of the wafer 102.

As in metal CMP operations the metallic layer must first be oxidized, the composition of slurry 118 is an important aspect of the metal CMP operations. In addition, the utilized slurry 118 must be chosen such that the slurry 118 would not induce corrosion and imperfections onto the wafer surface 102. As such, typical metal CMP slurries contain oxidizers and acids, each of which facilitates the conversion of metallization layers into oxide layers. Conventionally, these slurries are designed to be "highly stable" and as such have two basic characteristics. First, they have a sufficiently long shelf lifetime. Second, they require a significantly high amount of energy to be activated. As such, the highly stable characteristic of metal slurries yields a significantly low oxidation rate, hence reducing the overall removal rate. As a result, the overall time expended in the metal CMP process is significantly increased thereby reducing the throughput.

In view of the foregoing, a need therefore exists in the art for an enhanced chemical mechanical planarization system that yields a higher throughput utilizing conventional slurries.

SUMMARY OF THE INVENTION

Broadly speaking, the present invention fills these needs by manipulating the composition of slurry to enhance the removal rate of excess layers formed on a wafer surface. In one embodiment, the throughput of a chemical mechanical planarization (CMP) system is increased by enhancing the removal rate of excess layer via activation of an implemented slurry. In preferred embodiments, the removal rate of a wafer surface metallization layer is increased in a self-inhibiting CMP system through light induced slurry activation. Self-inhibiting CMP system is herein defined as a CMP system wherein the rate of oxide formation is greater than the rate of metal-oxide dissolution. It should be appreciated that the present invention can be implemented in numerous ways, including as a process, an apparatus, a system, a device, or a method. Several inventive embodiments of the present invention are described below.

In one embodiment, a chemical mechanical planarization (CMP) apparatus, is disclosed. The CMP apparatus includes a polishing pad configured to receive a slurry chemical. Also included in the CMP apparatus is a carrier head configured to hold a wafer having a metal surface layer. The carrier head and the polishing pad are configured to mechanically interface during polishing of the metal surface layer with the slurry chemical. The CMP apparatus further includes a radiation unit that is to be applied over the polishing pad at a location after a slurry delivery location and before the pad enters underneath the wafer. The radiation unit is designed to expose the slurry chemical to radiation just prior to the mechanical interface between the metal surface layer of the wafer and the polishing pad.

In another embodiment, a chemical mechanical planarization (CMP) apparatus is disclosed. The CMP apparatus includes a polishing pad designed to rotate and a carrier configured to hold a wafer to be polished. The CMP apparatus further includes a conditioning pad arranged beside the carrier. The polishing pad is designed to move while rotating between being partially over the carrier and the conditioning pad to progressively being completely off of the carrier and completely over the conditioning pad. Also included in the CMP apparatus is a slurry delivery unit. The slurry delivery unit is designed to apply slurry over the conditioning pad so that when rotating, the polishing pad can apply the slurry between the wafer and the polishing pad. The CMP apparatus also includes a radiation source designed to apply radiation to the slurry that is to be applied between the wafer and the polishing pad.

In still a further embodiment, a method for enhancing the removal of a wafer layer of a wafer in chemical mechanical planarization (CMP) systems is provided. The method includes applying radiation to an amount of slurry before the slurry is applied to the wafer layer.

In yet another embodiment, a chemical mechanical planarization (CMP) apparatus, is disclosed. The CMP apparatus includes a polishing pad configured to receive a slurry chemical. Also included in the CMP apparatus is a carrier head configured to hold a wafer having a metal surface layer. The carrier head and the polishing pad are configured to mechanically interface during polishing of the metal surface layer with the slurry chemical. The CMP apparatus further includes a radiation unit that is to be applied over the polishing pad at a location after a slurry delivery location. The radiation unit is designed to expose the slurry chemical to radiation just prior to the mechanical interface between the metal surface layer of the wafer and the polishing pad.

The advantages of the present invention are numerous. Most notably, instead of implementing slurry as is, the present invention activates the slurry in situ via radiation, thus enhancing the removal rate of metal in a CMP system.

Thus, the present invention facilitates and expedites the crossing of the activation barrier of the chemical reaction between the slurry and excess layer by introducing energy through applied radiation, e.g., UV or IR exposure. As such, by implementing the same quantity of conventional slurry and within the same period of time, the embodiments of the present invention can be made to yield higher throughputs without contaminating the wafer surface. In one embodiment, a multi-segment light source configuration is beneficial as it allows the CMP system to employ different removal rates on different portions of the wafer being processed, thus achieving a desired planarization profile for the wafer surface. The multi-segment light source configuration also has the capability of redistributing the activation efficiency of present invention and can selectively increase the rate of removal of one portion of semiconductor being polished in relation to others. Another advantage of the embodiments of the present invention is that more stable oxidizers and even gaseous oxygen can be implemented, thus allowing the design of slurries having improved shelf lifetimes.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 2A is a table of equations representing a production of a dissolved metal and metal by-products of a metallization layer as a result of chemical reactions between a metallization layer and a plurality of oxidation agents, in accordance with one embodiment of the present invention.

FIG. 3A-1 is a top view of a belt-type CMP system illustrating an activation of a slurry prior to its reaching a contact surface of a wafer with a polishing pad, in accordance with yet another embodiment of the present invention.

FIG. 3A-2 is a simplified, partial, cross-sectional view of the CMP system FIG. 3A-1 illustrating the activation of the slurry utilizing a single lamp, in accordance with yet another embodiment of the present invention.

FIG. 3B-1 is a simplified, partial, top view of a belt-type CMP system wherein a slurry is activated utilizing a plurality of lamps having different irradiation intensities, in accordance with one aspect of the present invention.

FIG. 3B-2 is an exploded, partial, cross-sectional view of the CMP system of FIG. 3B-1 illustrating the capability of the present invention to produce slurries having different activation levels, in accordance with another aspect of the present invention.

FIG. 3C-1 illustrates an exploded, partial cross-section of a wafer having a copper layer, in accordance with yet another embodiment of the present invention.

FIG. 3C-2 is an exploded, partial cross-sectional view of a portion of a top layer of a wafer having an activated copper layer, wherein the activated copper layer has a plurality of depths, in accordance with another aspect of the present invention.

FIG. 3C-3 is an exploded, partial cross-sectional view of a portion of a top layer of a wafer having an activated copper layer, wherein one of the plurality of depths of the activated copper layer has reacted with an activated slurry, in accordance with yet another embodiment of the present invention.

FIG. 3C-4 is an exploded, partial cross-sectional view of a portion of a top layer of a wafer having an activated copper layer, wherein one of the depths of the activated copper layer have been removed, in accordance with yet another embodiment of the present invention.

FIG. 3C-5 is an exploded, partial cross-sectional view of a portion of a top layer of a wafer having an activated copper layer, wherein the plurality of depths of the activated copper layer have all been removed, in accordance with another embodiment of the present invention.

FIG. 4 is an illustration of a Variable Partial Overlapping (i.e., Subaperture) CMP system, in accordance with one implementation of the present invention.

DETAILED DESCRIPTION OF EXEMPLARY EMBODIMENTS

Figure 1:
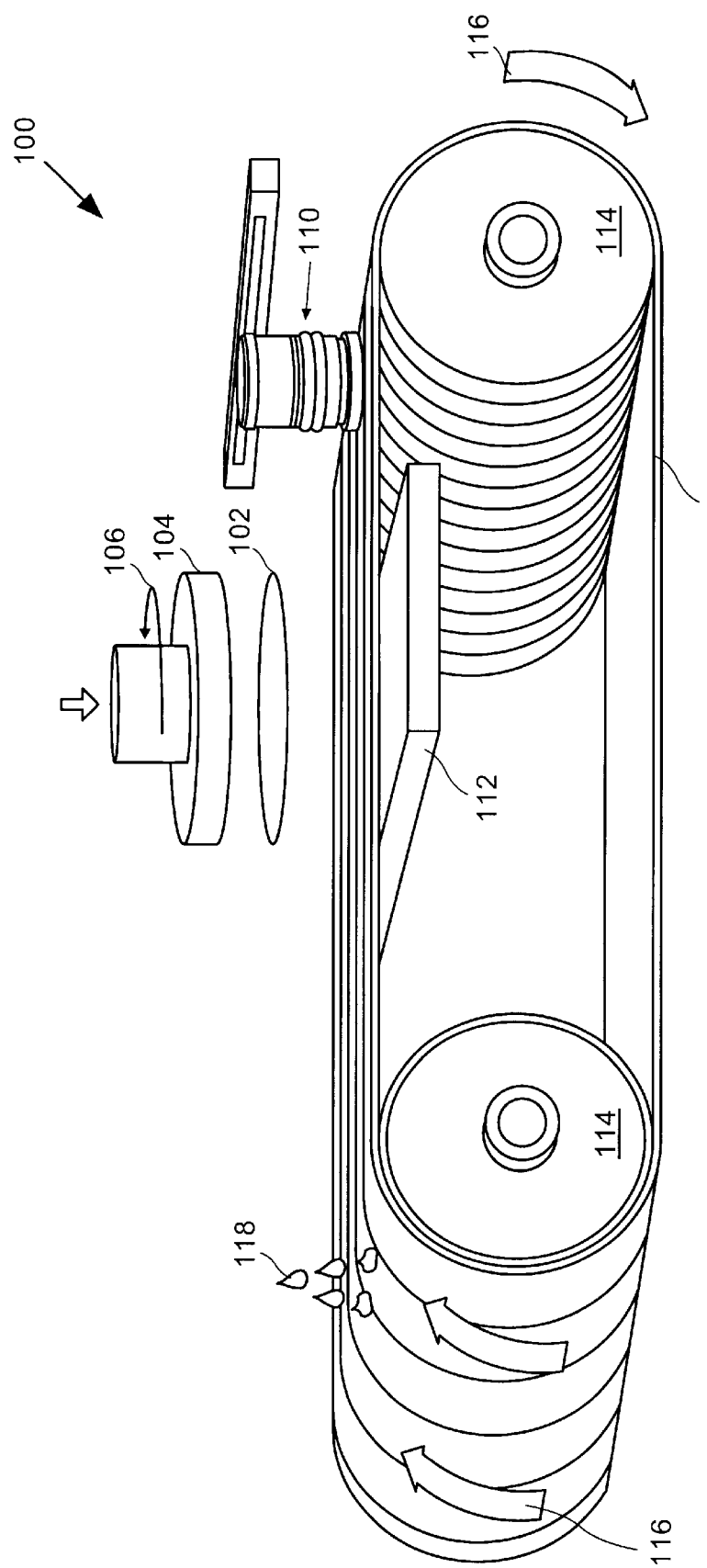
FIG. 1 illustrates an exemplary prior art CMP system.

Embodiments of a chemical me chemical planarization (CMP) system for optimizing the system throughput via enhancing the removal rate of excess layers formed on wafer surfaces are described. In a preferred embodiment, the CMP system enhances removal rate by implementing an activated slurry. In one embodiment, the slurry is activated through infrared (IR) or ultraviolet (UV) radiation. Preferably, in a self-inhibiting metal CMP system, the slurry containing a plurality of oxidizing agents is activated so as to expedite a chemical reaction between the oxidizing agents and the metallization layer. As a result, a metal-oxide layer is formed which is then more easily removed by mechanical action over the surface of the wafer, e.g., by the interaction between the polishing pad, slurry and wafer. As such, in preferred embodiments, a rate of oxide formation of the irradiated metal CMP system is greater than that of a non-irradiated system, thus enhancing the removal rate of the irradiated CMP system and hence its throughput.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

FIG. 2A is a table 150 of equations representing a production of a dissolved metal and metal by-products of a metallization layer as a result of chemical reactions between a metallization layer and a plurality of oxidation agents, in accordance with one embodiment of the present invention. As shown in Equation 1, in one embodiment, during a metal CMP operation of a metallization layer $M_{layer}$ of a wafer, a solution of soluble metal compounds $M_{dissolved}$ and by-products are produced as a result of a chemical reaction and interaction between a plurality of oxidizing agents, dissolving agents, and the metallization layer $M_{layer}$. As shown in the Equation 2, the rather simple chemical reaction of Equation 1 has actually proceeded in two substantially consecutive stages. In an initial oxidation stage having a rate of oxide formation $R_{ox}$, a solid metal$_{(s)}$ enters into a chemical reaction with one or more oxidizing agents, thereby producing a solid metal-oxide M-oxide$_{(s)}$. Subsequently, in a dissolving stage having a rate of dissolution $R_{dis}$, one or more dissolving agents enter into chemical reaction with the resulting solid metal oxide M-oxide$_{(s)}$ of stage 1, thus producing a dissolved metal solution $M_{dis}$ and by-products.

As a purpose of performing the CMP operation is to achieve a substantially planarized surface, it is preferable that the resulting solid metal-oxide layer M-oxide$_{(s)}$ be removed by the mechanical component of the CMP operation rather than its chemical component. The mechanical removal of the solid metal oxide layer M-oxide$_{(s)}$ is preferable for several reasons. First, the chemical component of the CMP operation is pressure sensitive, whereas the chemical component is not. That is, during the mechanical polishing of a wafer, the higher the topography features of a wafer are, the more pressure is created in the polishing interface, thus increasing the removal of the solid metal-oxide layer M-oxide$_{(s)}$ from the feature tops, thereby achieving a planarized topography. Second, the CMP operation may introduce an undesirable wafer copper corrosion if it utilizes a faster rate of dissolution $R_{dis}$ than the rate of oxide formation $R_{ox}$. This can be further understood in reference to Equation 3 of table 150 of FIG. 2A. As shown, in situations wherein oxides are formed slowly, the rate of oxide formation $R_{ox}$ is less than the rate of dissolution $R_{dis}$. In such situations, copper corrosion may occur, as nothing prevents copper from continuous oxidation/dissolution. In contrast, in situations wherein oxides are formed rapidly, the rate of oxide formation $R_{ox}$ is greater than rate of dissolution $R_{dis}$, thus inhibiting and substantially completely halting the reaction once an impenetrable oxide layer is formed. As a result, to achieve the objective of removing the solid metal-oxide layer M-oxide(s) mechanically and without introducing copper corrosion, it is preferable that the rate of oxide formation $R_{ox}$ be greater than the rate of dissolution $R_{dis}$.

Accordingly, in preferred embodiments, the CMP operation of the present invention is self-inhibiting, defined as a CMP process wherein the oxidation rate of the metallization layer is faster than the dissolution rate of the resulting solid metal-oxide layer. However, in such CMP systems, it is preferable that the resulting solid metal-oxide layer be removed substantially instantaneously, as otherwise, the resulting solid metal-oxide layer completely coats (i.e., inhibits) the wafer surface, thus bringing the oxidation process to a halt. As such, "wet etch" processes are disfavored in metal CMP operations as they have a slower rate of oxide formation $R_{ox}$ than the rate of dissolution $R_{dis}$. Further details regarding the rate of oxide formation are set forth below in connection with FIG. 2B.

In view of the preference for implementing a self-inhibiting CMP process, selecting a proper composition of slurry is beneficial. As it is advantageous to have a faster rate of oxide formation $R_{ox}$ than a rate of dissolution $R_{dis}$, preferably, the implemented slurry includes oxidizers (e.g., hydrogen peroxide, ferric nitrate, permanganates, dissolved gaseous oxygen, dissolved gaseous ozone, ammonium nitrate, potassium nitrate, copper nitrate, potassium bichromate, etc.) For instance, in copper CMP, a variety of different oxidizers may be utilized in the slurry (e.g., hydrogen peroxide, ferric nitrate, permanganates, dissolved gaseous oxygen, dissolved gaseous ozone, ammonium nitrate, potassium nitrate, copper nitrate, potassium bichromate, etc. In a preferred embodiment, peroxide is a very effective copper oxidizer. Although, nearly most of the slurries contain peroxide, some companies introduce different oxidizers for oxidation of the metallization layer $M_{layer}$.

Figure 2B:
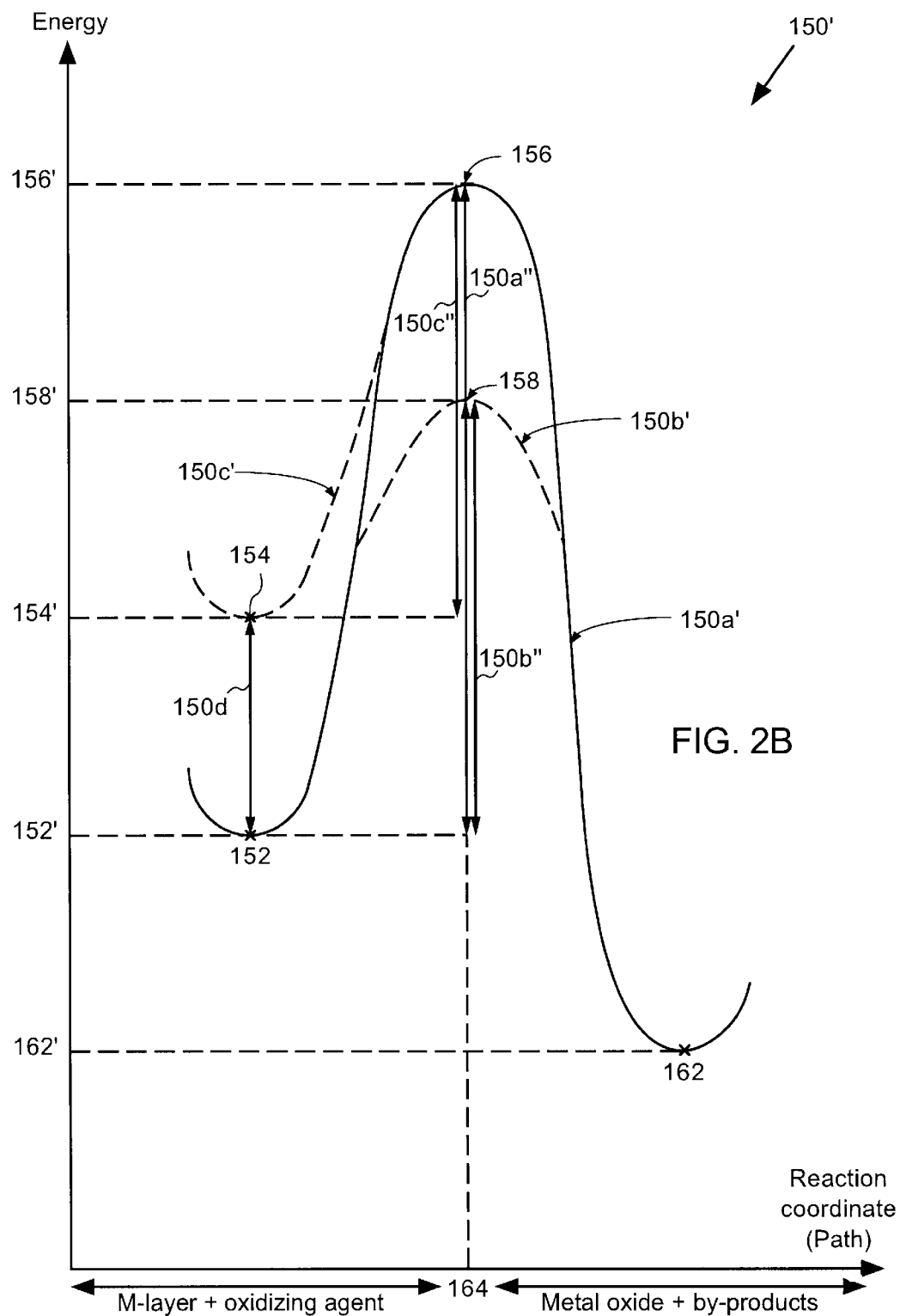
FIG. 2B are plots of chemical equations of FIG. 2A, exhibiting a decrease in an amount of energy required to overcome an activation barrier with an increase in temperature, in accordance with another embodiment of the present invention.

FIG. 2B depicts a graph of the chemical equations of table 150 of FIG. 2A exhibiting a decrease in an amount of energy required to cross an activation barrier as temperature increases, in accordance with one embodiment of the present invention. As shown, the vertical axis of the graph reflects the energy variations applicable to the analyzed system, while the horizontal axis represents the different stages of the chemical reaction path. In one embodiment, a plot 150a' starts at a point 152 revealing a potential energy surface minimum for the non-irradiated metallization layer $M_{layer}$ and oxidizing agents. Normally, repulsive forces between molecules prevent the molecules of the metallization layer $M_{layer}$ and oxidizing agents to chemically react with one another. Accordingly, in order to help the reaction to proceed and to overcome these repulsive forces, an excessive amount of energy is required to be introduced into the system. As shown, a maximum point 156 of the plot 150a' represents the potential energy surface that has to be overcome before the system enters a product-state. The excessive amount of energy that has to be introduced into the system so as to overcome the molecular repulsion is known as an "activation energy," or "activation barrier." Only the molecules having energy higher than the activation barrier can overcome the activation barrier and pass into the products state. The higher is the activation barrier, the lower is the number of molecules that are capable overcoming the barrier, the slower the reaction between the metallization layer $M_{layer}$ and oxidizing agents proceeds.

As shown, a $E_{act}$ 150a" represents the amount of energy required to be present for the chemical reaction between the metallization layer $M_{layer}$ and the oxidizing agents to proceed. Roughly, for an oxidation reaction, $E_{act.}$ 150a" represents the amount of energy required to break specific molecular bonds within the oxidizing agents so as to release an active oxide atom to freely react with the metallization layer $M_{layer}$. As shown, once the activation barrier is overpassed, the system spontaneously forms copper oxide(s) and the corresponding by-products. As a result, the most energized molecules would be able to react with each other by overcoming the activation barrier, thereby defining the reaction rate. As shown, the higher the temperature of the system, the more molecules would be capable of overcoming the activation barrier. Alternatively, at any given temperature, the lower is the activation barrier, the greater is the number of molecules capable of overpassing the activation barrier.

The reaction rate may be enhanced through either catalytic rate enhancement or reactant excitation. In catalytic rate enhancement, as depicted in plot 150b', the amount of energy required to cross the activation barrier is reduced via interaction with the catalyst. As shown, the amount of energy required to reach the peak point 158 of plot 150b' is substantially lower than the amount of energy required to reach the maximum point 156 of plot 150a'. In another words, the activation energy of a catalytic rate enhanced system $E_{act.-cat.}$ 150b" is substantially lower than the activation energy for a non-catalytic system $E_{act.}$ 150a'.

Alternatively, in a different embodiment, the reaction rate may be enhanced by increasing the energy of the system through reactant excitation. This has been illustrated by a plot 150c' of FIG. 2B. As shown, the plot 150c' starts at a state 154 wherein some external energy defined as excitation energy $E_{ex.}$ 150d has been pumped into the system utilizing an external energy source (e.g., heating, irradiation, pressure shock, etc.). As shown, the more energy is introduced into the system, the lower is the activation energy $E_{act.-ex.}$ 150c" (i.e., the amount of energy required to cross the activation barrier 164) and the higher is the reaction rate. Thus, by increasing the initial energy of the metallization layer $M_{layer}$ and the oxidizing agents, the amount of energy required to overcome the activation barrier is significantly diminished enhancing the rate of the oxide formation and finally the CMP removal rate.

The lowering of energy required to cross the activation barrier can further be understood with respect to an exemplary copper CMP system utilizing a slurry having peroxide (i.e., $H_2O_2$ or H—O—O—H) as an oxidizer. As is well known, peroxide includes two oxygen atoms, one of which must be detached to participate in the oxidation process of the metallization layer $M_{layer}$. As such, energy is required to break or at least to weaken the appropriate molecular bonds, thus liberating the oxygen to freely enter into a chemical reaction with the copper metallization layer $M_{layer}$. Thus, for the chemical reaction between the metallization layer $M_{layer}$ and the peroxide to occur, energy is required to weaken or break the molecular bonds in the peroxide. In one embodiment, the chemical reactions between the metallization layer $M_{layer}$ and oxidizing agents are enhanced by further activating the oxidizer utilizing IR or UV radiation. IR radiation is configured to cause excited translational and vibrational motion of the molecules in the slurry, and the UV radiation is configured to enhance the reaction rate through the excitation of valence electrons and weakening or even breaking the chemical bonds in the reactant molecules.

Figures 1, 3A:
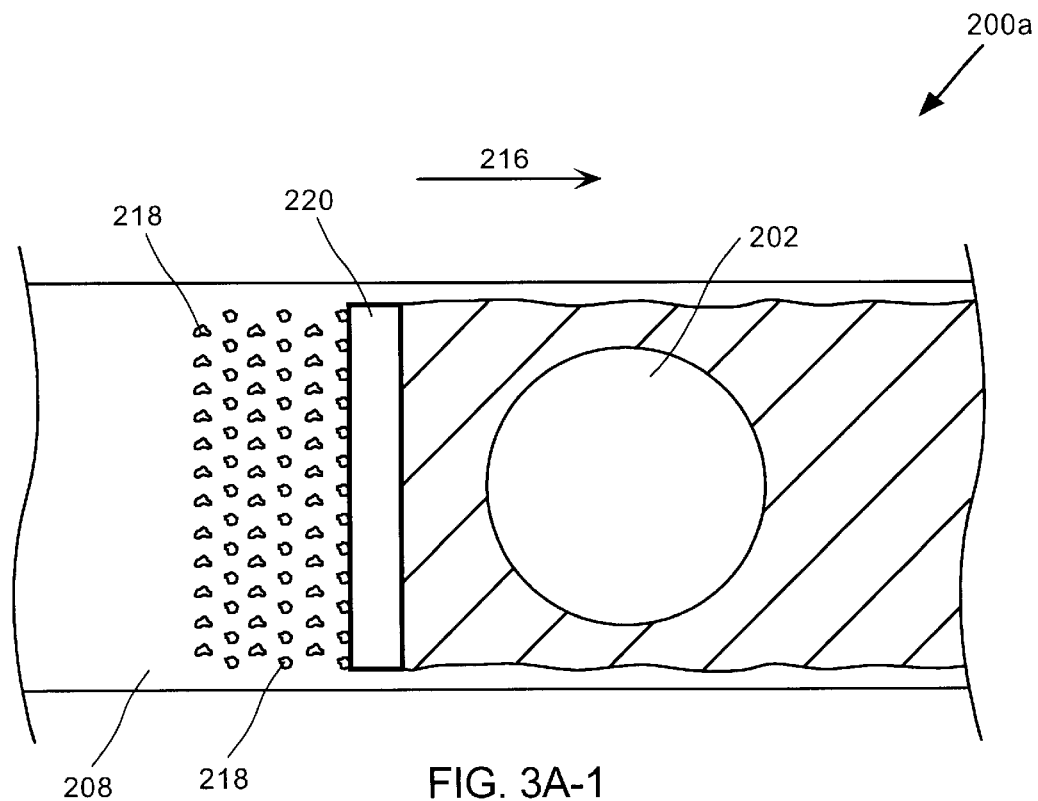

FIG. 3A-1 is a simplified top view of a belt type CMP system 200a illustrating an activation of a slurry prior to reaching a contact surface of a wafer with a polishing pad 208, in accordance with one embodiment of the present invention. As shown, a wafer 202 is configured to be applied to a polishing pad 208 as the polishing pad moves in a rotation direction 216. A slurry 218 is introduced onto a surface of the polishing pad 208, which in this embodiment, is defined before a contact surface of the wafer 202 and the polishing pad 208. The slurry 218 is introduced onto the polishing pad 208 such that it substantially covers a width of the polishing pad 208, thereby wetting the polishing pad 208. A lamp 220 is positioned substantially above the moving polishing pad 208 such that radiation produced by the lamp 220 is applied to the slurry 218 before the slurry 218 reaches the polishing interface of the wafer 202 and the polishing pad 208. Preferably, the lamp 220 is configured to be an IR or a UV lamp. However, in a different embodiment, the lamp 220 may be any type of lamp or radiation unit so long as its function of providing energy necessary to activate the slurry without introducing copper corrosion or imperfections onto the wafer surface 202 is achieved. Preferably, in one embodiment, the slurry 218 includes peroxide or dissolved oxygen. However, in a different embodiment, the slurry 218 may include any type of oxidizer.

As shown in this configuration, unlike conventional copper CMP systems, the slurry 218 of this embodiment is configured to be rapidly activated by the IR radiation of the IR light or by the radiation of the UV lamp 220. Typically, in prior art copper CMP systems, the energy required to cross the activation barrier is created purely by the mechanical component. That is, as the slurry is delivered to the polishing interface of the wafer and the polishing pad, the movements of the pad, the wafer, and the slurry, cause the temperature of the polishing interface to rise thus increasing the number of molecules capable of crossing the activation barrier. Accordingly, in such situations, a chemical reaction between the metallization layer $M_{layer}$ and the oxidizing agent may not occur for an extended period of time. Furthermore, as the length of time required to break the activation barrier is significantly greater, so is the amount of time it takes to form a layer of copper oxide over the metallization layer $M_{layer}$, hence reducing the overall removal rate of metal-oxide (e.g., such as in copper CMP processes). As such, the time expended for the overall CMP process is greater, thereby creating an adverse affect on the throughput.

Contrary to the copper CMP processes of the prior art, the present invention achieves a significantly high removal rate. In one aspect of the present invention, a significant amount of energy produced by photons of the UV lights is configured to be sufficient to break the bonding between the atoms of the peroxide or any other oxidizer that is implemented, thereby enhancing the speed of the oxide formation of the copper CMP operation. As the moving polishing pad 208 is applied to the wafer 202, the activated slurry 218 containing peroxide enters into a chemical reaction with the copper layer of the wafer 202. As the slurry 218 is activated, the activated slurry 218' contains free oxide atoms ready to enter into chemical reaction with the metallization layer $M_{layer}$ of the wafer 202, thus more quickly creating a layer of copper oxide from the copper layer. That is, as a result of the chemical reaction, the metallic bonding of the copper layer has changed into a molecular bonding as more commonly exists in copper oxide. Thus, the present invention utilizes two forms of energy to break the activation barrier. The first form of energy is the energy created by the mechanical movements of the surface of the wafer 202 against the polishing pad 208 of the copper CMP system. The second form of energy is the energy generated from IR radiation or UV radiation. Utilizing these two forms of energy, the present invention expedites the formation of the resulting solid oxide-metal layer, thus increasing the rate of oxide formation $R_{ox}$. As a result, the overall time expended in the copper CMP operation of the wafer 202 is reduced significantly.

Furthermore, the removal rate of the resulting solid oxide-metal layers directly depends upon the rate of oxide formation $R_{ox}$ of the copper layer. Thus, the greater is the rate of oxide formation $R_{ox}$, the faster the resulting solid oxide-metal layer can be removed from the surface of the copper layer. The same also applies to the subsequent oxide-metal layers. To be more specific, the overall removal rate of the copper CMP operation is limited by the rate of oxide formation on the copper layer, which itself is directly related to an activation rate of the slurry 218. Additional details regarding the dependability of the rate of oxide formation and the overall removal rate of the copper CMP system are set forth below in connection with FIGS. 3C-1 through 3C-5.

Figures 2, 3A:
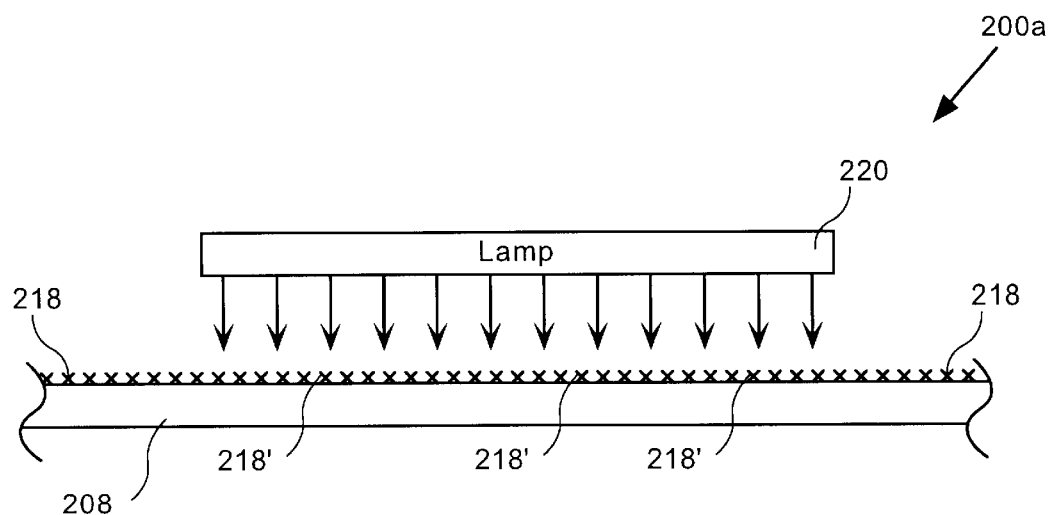

FIG. 3A-2 is a simplified, partial, cross-sectional view of the CMP system 200a of FIG. 3A-1 illustrating the activation of the slurry utilizing a single lamp, in accordance with one embodiment of the present invention. As shown, in this embodiment, a single lamp 220 is configured to substantially uniformly apply IR or UV radiation on the slurry 218 thus activating the slurry 218. The length of the lamp 220 is configured to range approximately from about 6½ inches to about 12½ inches, and preferably is slightly larger than the wafer size. As fully described above, the activated slurry 218' is configured to include an increased amount of activated oxidizer molecules ready to enter into chemical reaction with the abrasively activated copper layer of the wafer 202 so as to create an oxidized layer.

Figures 1, 3B:
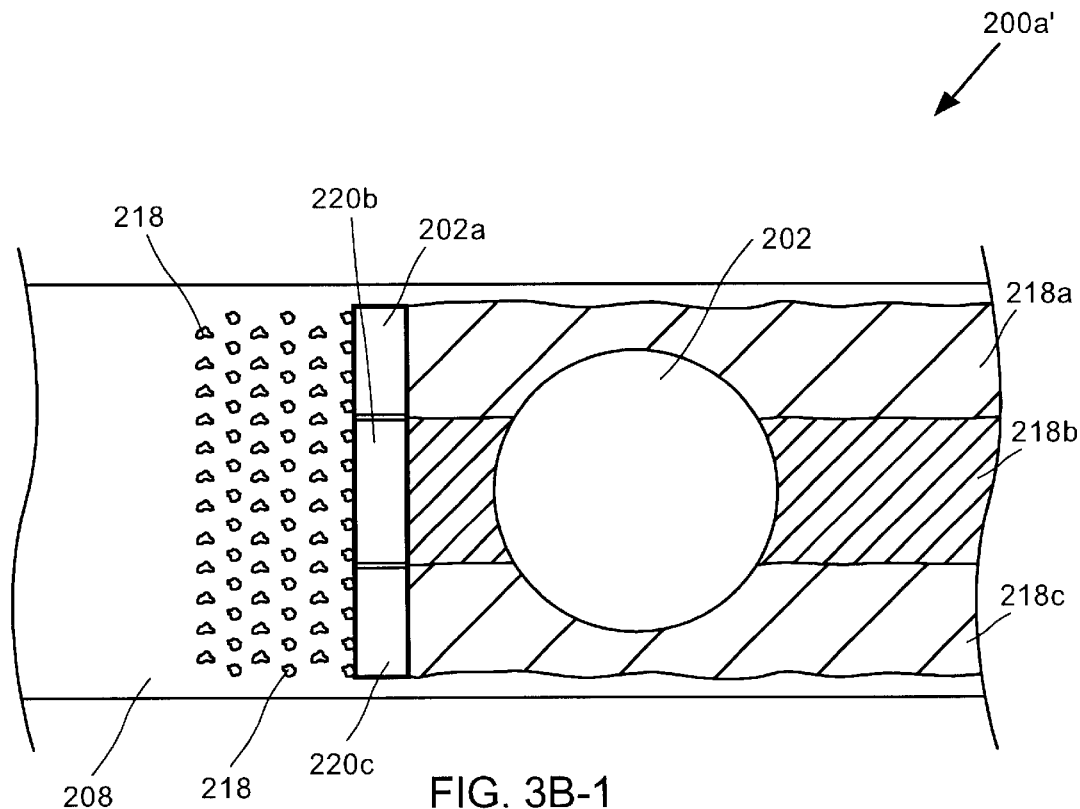
Figures 2, 3B:
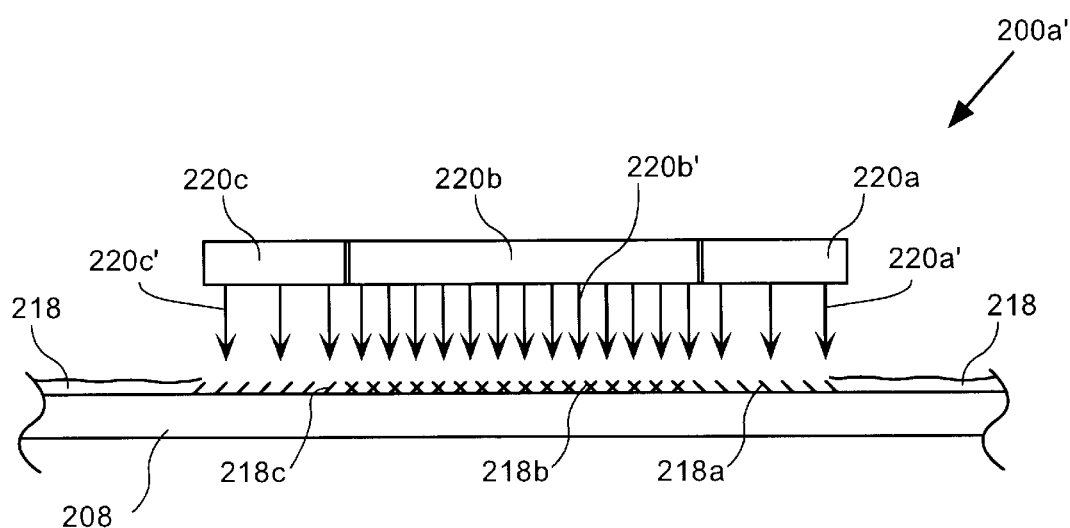

FIG. 3B-1 is a simplified, partial, top view of a belt-type CMP system 200a' wherein a slurry is activated utilizing a plurality of lamps having different intensities (e.g., which can also be programmable in terms of intensity). As shown, a slurry 218 is introduced onto the polishing pad 208 as the polishing pad 208 moves in a movement direction 216. A side lamp 220a, a center lamp 220b, and a side lamp 220c are substantially positioned above the polishing pad 208 such that the side lamp 220a, the center lamp 220b, and the side lamp 220c are disposed side by side of one another on a substantially same vertical line. In one embodiment, the side lamp 220a, the center lamp 220b and the side lamp 220c are configured to each have a different radiation intensity so as to produce a corresponding activated slurry having different activation intensities. Again, in the embodiment of FIG. 3B-1, slurry 218 is rapidly activated before it reaches the polishing interface between the wafer 202 and the polishing pad 208. As slurry is UV activated before it reaches the polishing interface, the activation of slurry activity does not affect the thermal properties of any of the other CMP process consumables or the wafer surface. For instance, as it is beneficial to maintain the temperature of the polishing pad 208 as low as possible, the present invention increases the slurry activity without increasing the temperature of the polishing pad 208.

FIG. 3B-2 is an exploded, partial, cross-sectional view of the CMP system 200a' of FIG. 3B-1 illustrating the capability of the present invention to produce slurries having different activation levels, in accordance with one embodiment of the present invention. As shown, the side lamp 220a having a radiation intensity of 220a' is utilized to activate slurry 218 targeted to move under a side portion of the wafer 202, thus producing an activated side slurry 218a. Center lamp 220b has the intensity level of 220b' and is configured to activate a portion of slurry 218 that is targeted to move under a center portion of the wafer 202 so as to produce activated center slurry 218b. The side lamp 220c having an intensity of 220c' is to be applied to a portion of the slurry 218 targeted to move under a side portion of the wafer 202, thus creating activated side slurry 218c. In this exemplary embodiment, the lamp intensities 220a', 220b', and 220c' are configured to be programmably selected such that intensity 220b' is greater than intensities 220a' and 220c', and intensity 220c' is greater than intensity 220a'.

The use of the multi-segment light source configuration is advantageous as it allows the copper CMP system to promote different removal rates on different portions of the wafer being polished, thus achieving the desired planarized surface in view of the specific layers to be polished. As is well known, wafer surface topography sometimes differs from the edge of the wafer 202 to the center of the wafer 202. The embodiments of present invention provide the capability of selectively increasing the rate of removal of one portion in relation to others (e.g., more for the center of the wafer 202 as opposed to the edge of the wafer 202). Although this embodiment has been designed so as to utilize three separate lamps, it will be appreciated by those skilled in the art that the present invention can be implemented such that any number of lamps or multi-segment units may be implemented to activate the slurry.

Figures 1, 3C:
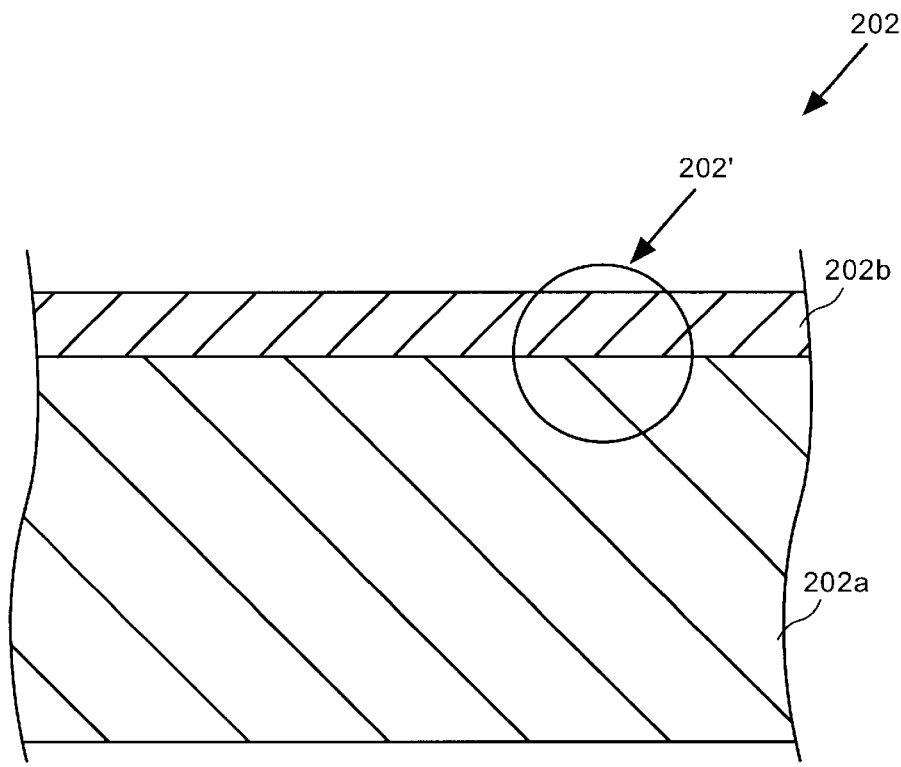
Figures 2, 3C:
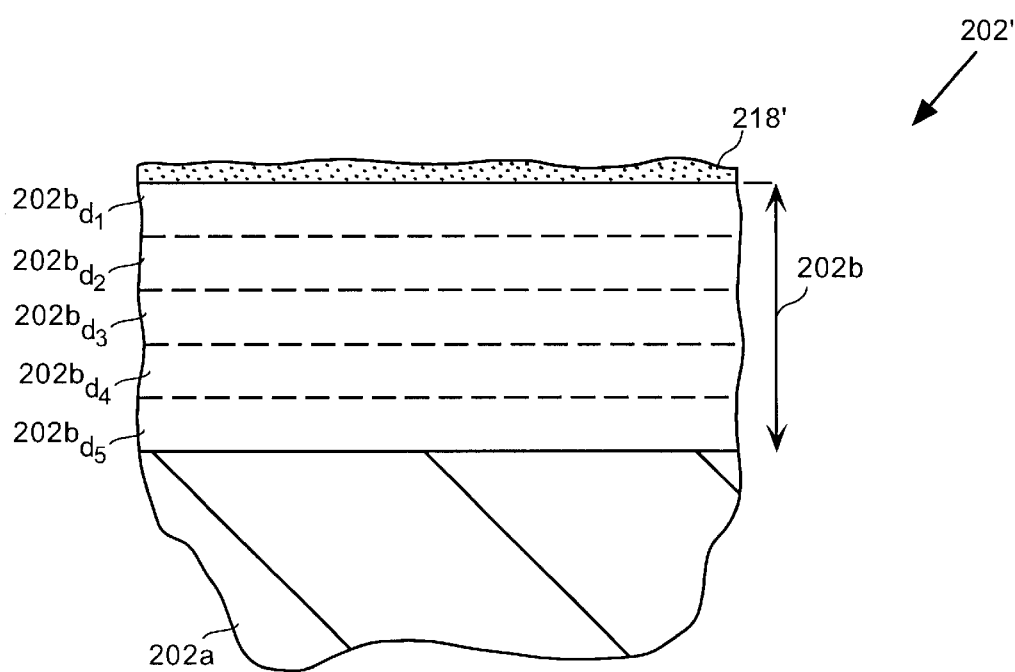

FIGS. 3C-1 through 3C-5 are exploded partial, cross-sectional views of different stages of performing chemical mechanical planarization on a portion of a wafer having a copper layer, in accordance with one embodiment of the present invention. FIG. 3C-1 depicts a wafer 202 having a dielectric portion 202a and a copper layer 202b. In FIG. 3C-2, an exploded cross-sectional view of a top layer piece 202' of the wafer 202 is illustrated. Although this illustration shows several dashed layers within the copper layer 202b, only the topmost layer is being activated at any one point as the copper is polished away. With this in mind, an activated slurry 218' is introduced onto the copper layer 202b. For illustration purposes only, the copper layer 202b of FIG. 3C-2 has been divided by dashed lines into a plurality of copper depths defined as depth 1 $202b_{d1}$, depth 2 $202b_{d2}$, depth 3 $202b_{d3}$, depth 4 $202b_{d4}$, and depth 5 $202b_{d5}$; with depth 1 $202b_{d1}$ being the copper depth closest to the surface of the wafer 202 and the depth $202b_{d5}$ being the closest depth to the wafer dielectric portion 202a. As shown in FIG. 3C-2, the activated slurry is applied to a top surface of the depth $202b_{d1}$ by mechanical contact with the polishing pad.

Figures 3, 3C:
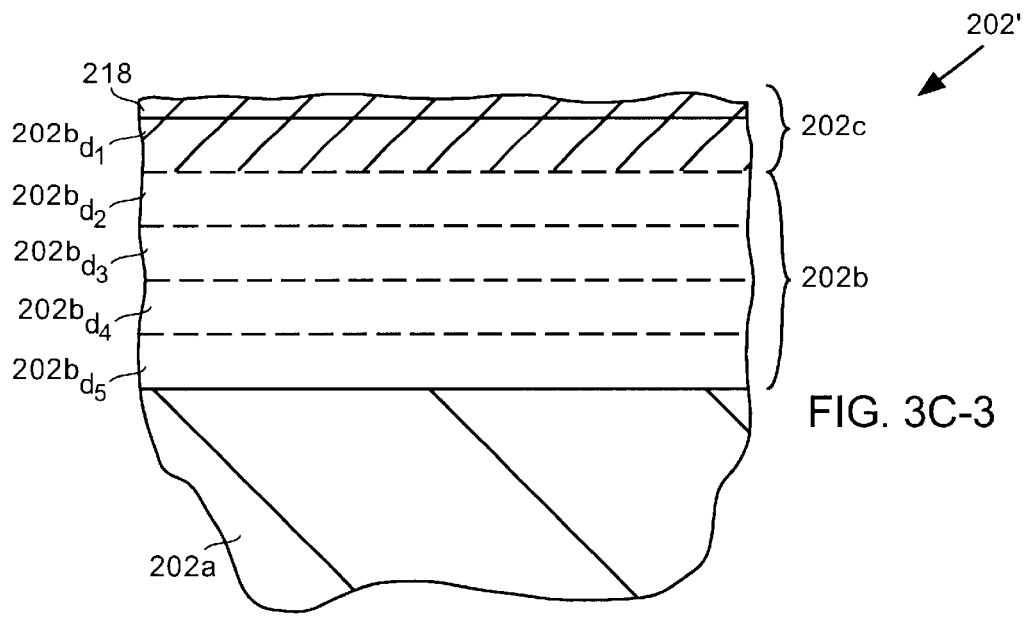
Figures 3, 3C, 4:
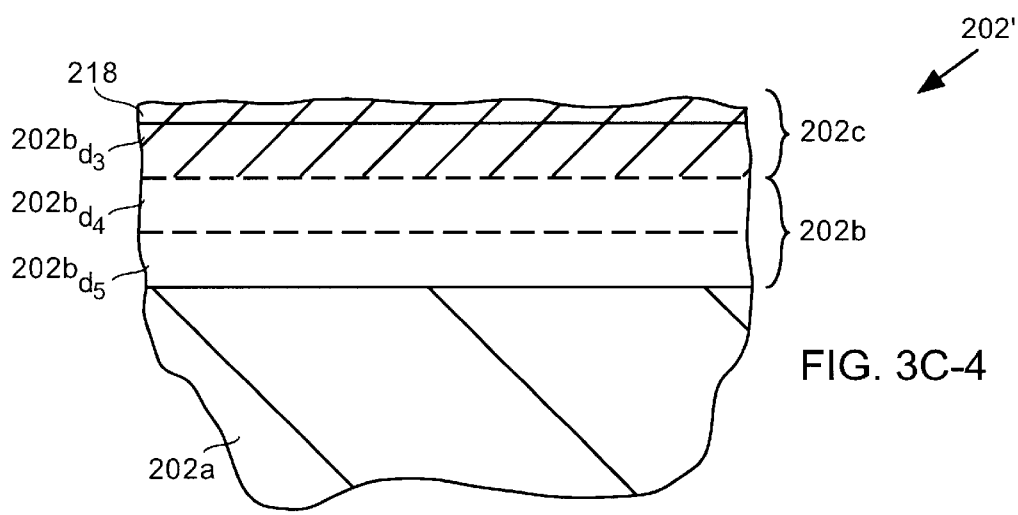
Figures 3, 3C, 4, 5:
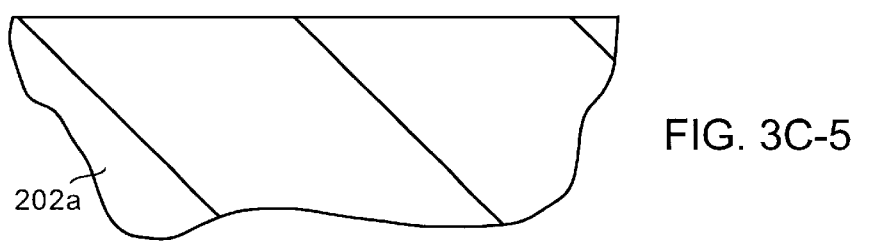
Figure 4:
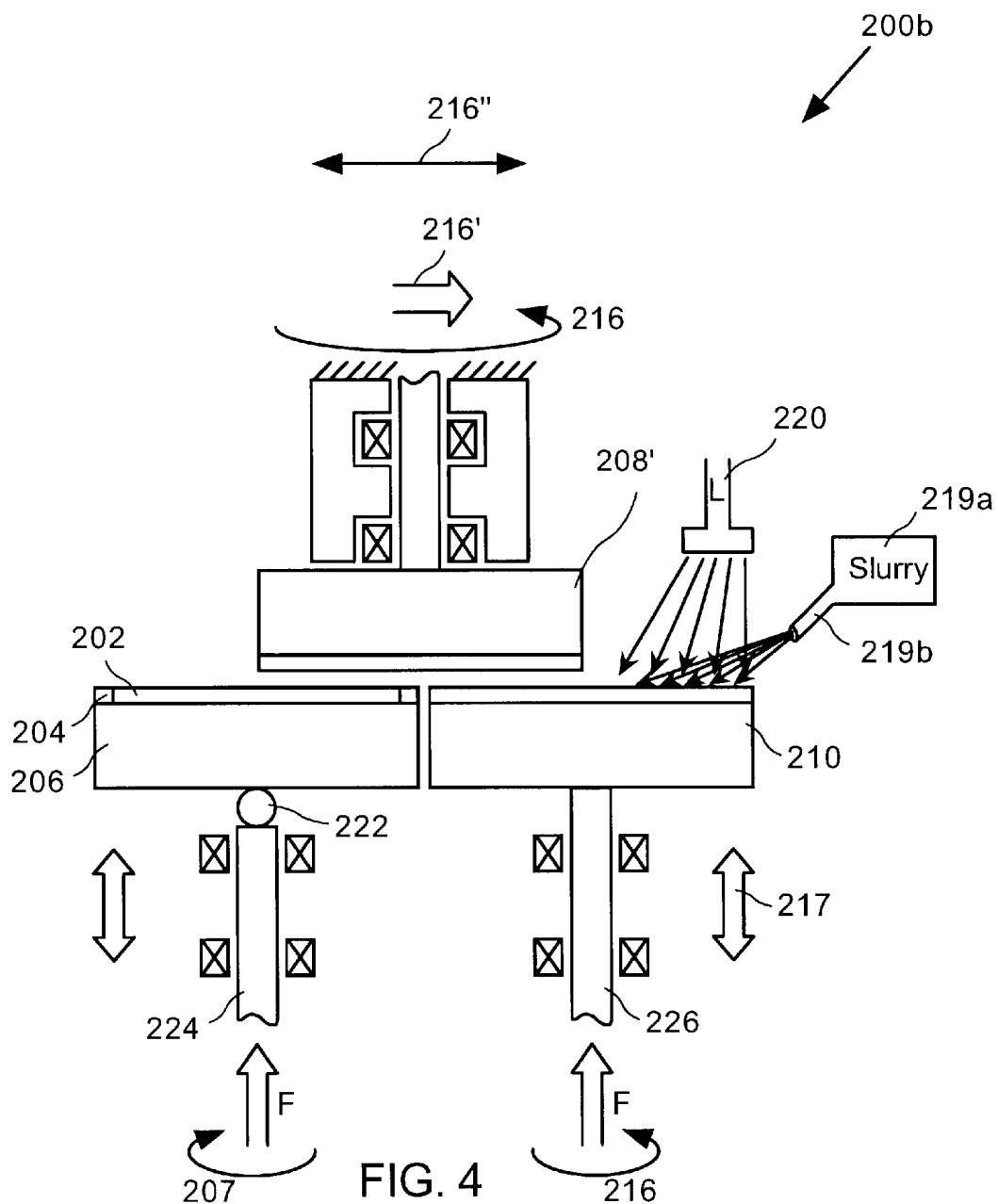

Referring to the embodiment of FIG. 3C-3, the depth 1 $202b_{d1}$ of the copper layer has reacted with the activated slurry 218' thus producing a copper oxide-slurry film 202c. As shown, the copper oxide-slurry layer 202c substantially covers the entire surface of the wafer 202. At this point, the depth 1 $202b_{d1}$ is removed without the aforementioned problems associated with conventional metal CMP. That is, the copper removal essentially approximates the removal of oxide and less that of ductile metal removal. As illustrated, at this stage, the copper layer 202b of FIG. 3C-3 now includes depth 2 $202b_{d2}$, depth 3 $202b_{d3}$, depth 4 $202b_{d4}$, and depth 5 $202b_{d5}$. FIG. 3C-4 depicts the wafer 202 at a point in time wherein the activated slurry is defined on the surface of the depth 3 $202b_{d3}$ of the copper layer 202b. In this embodiment, the depth 3 $202b_{d3}$ of the copper layer has reacted with the activated slurry 218' thus producing a copper oxide-slurry layer 202c near the surface of the wafer 202. As illustrated, at this stage, the copper layer 202b of FIG. 3C-4 only includes depth 4 $202b_{d4}$ and depth 5 $202b_{d5}$. Accordingly, depths $202b_{d1}$ and $202b_{d2}$ have already reacted with the activated slurry 218' and have been mechanically removed. Finally, in the embodiment of FIG. 3C-5, the copper layer 202b has substantially been removed, leaving behind a substantially planarized and flat wafer dielectric 202a.

As shown, the removal rate of the copper CMP system depends on the formation of the copper-oxide layers on the surface of the wafer 202. Further shown is that the activated slurry 218' can enter into chemical reaction with only certain depths of the activated copper layer 202b at any given time. As such, the overall quality of the copper CMP system depends on the rate of oxide formation. That is, the faster the copper-oxide layers are formed, the faster the metallization layer $M_{layer}$ can be removed from the surface of the wafer 202.

FIG. 4 is a simplified cross-sectional view of a Variable Partial Overlapping (i.e., subaperture) CMP system 200b, in accordance with one embodiment of the present invention. The embodiment of FIG. 4 includes a polishing head 208' configured to polish the surface of a wafer 202 as the polishing head 208' rotates in polishing rotation direction 216 and moves from a center of the wafer 202 to an edge of the wafer 202 in a movement direction 216'. The polishing head 208' is further configured to move back and forth in an oscillation direction 216" so as to create an oscillating movement. As shown, in this embodiment, a carrier 206 is positioned below the polishing head 208'. The carrier 206 is configured to engage the wafer 202 using a retainer ring 204. As shown, in one embodiment, the retainer ring 204 is configured to maintain a co-planer relationship with the wafer 202 while the wafer 202 is being polished by the polishing head 208'. In this embodiment, the exposed surface of the wafer 202 is configured to face the polishing head 208'. In one embodiment, a gimbal 222 is positioned underneath the carrier 206 and is defined to align the carrier 206 to the moving polishing head 208' during the CMP process. The gimbal 222 is mounted on an extending spindle 224, which rotates in the direction of wafer rotation 207. The extending spindle is configured to apply a force F onto the carrier 206.

A conditioning head 210 is configured to be positioned to the right (or any side) of the carrier 206 and below the polishing head 208 so as to condition the polishing head 208'. Similar to the polishing head 208', the conditioning head 210 is configured to rotate in the same rotation direction as the polishing head 208' (i.e., the polishing rotation direction 216). The conditioning head 210 is mounted on a conditioning spindle 226. The conditioning spindle 226 is configured to apply a force F onto the conditioning head 210. A supply of slurry 218 located in a container 219a is directed to the surface of the conditioner 210 through a slurry delivery unit 219b. A lamp 220 is positioned substantially above a portion of the conditioning head 210 so as to activate the slurry 218 as the slurry 218 is directed to the conditioning interface of the conditioning head 210 and the polishing head 208' and subsequently to the polishing interface of the polishing head 208' and the wafer 202. In still another embodiment, the slurry in an activated form can be supplied to the wafer surface through a delivery conduit (not shown) formed in the polishing head 208'. In one embodiment, the lamp 220 may be an IR or a UV lamp.

Although in this embodiment slurry 218 is activated after it has been guided onto the conditioning head 210, in a different embodiment, the supply of slurry 218 may be activated while slurry 218 is in the container 219a. Thereafter, once slurry 218 has been activated, the activated slurry 218' may be introduced onto the conditioning head 210 such that the activated slurry 218' can be introduced into the polishing interface through the conditioning interface. The applying of light onto the slurry 218 introduced to the conditioning head 210 rather than the polishing head 208' is beneficial, as it is preferred to maintain the temperature of the polishing head 208' as low as possible. For additional information on subaperture CMP, reference can be made to: U.S. patent application No. 09/644135, filed on Aug. 22, 2000, having inventors Miguel A. Saldana, John M. Boyd, Yehiel Gotkis, and Aleksander A. Owczarz, and entitled "SUBAPERTURE CHEMICAL MECHANICAL POLISHING SYSTEM." This U.S. Patent Application, which is assigned to Lam Research Corporation, the assignee of the subject application, is incorporated herein by reference.

IR and UV lamps have been described as useful to activate the slurry, however, it will be apparent to those skilled in the art that other types of light radiating systems can be used to activate slurry in a CMP system. Additionally, depending on the application, the intensity of the lamps may be controllably adjusted to achieve the desired level of $R_{ox}$ in relation to $R_{dis}$.

Although the foregoing invention has been described in some detail for purposes of clarity of understanding, it will be apparent that certain changes and modifications may be practiced within the scope of the appended claims. For example, embodiments described herein have been primarily directed toward wafer chemical mechanical polishing; however, it should be understood that the chemical mechanical planarization operation of the present invention is well suited for polishing any type of substrate. Furthermore, implementations described herein have been particularly directed toward copper chemical mechanical polishing; however, it should be understood that the chemical mechanical planarization operations of the present invention are well suited for polishing of any type of dielectric or metal (e.g., Tungsten and other metals or alloys). Accordingly, the present embodiments are to be considered as illustrative and not restrictive, and the invention is not to be limited to the details given herein, but may be modified within the scope and equivalents of the appended claims.

What is claimed is:

1. A chemical mechanical planarization (CMP) apparatus, comprising:

a polishing pad configured to receive a slurry chemical;

a carrier head configured to hold a wafer having a metal surface layer, the carrier head and the polishing pad are configured to mechanically interface during polishing of the metal surface layer with the slurry chemical; and a radiation unit having a bar shape, the radiation unit configured to be applied over the polishing pad at a location after a slurry delivery location and before pad enters underneath the wafer so as to expose the slurry chemical to radiation just prior to the mechanical interface between the metal surface layer of the wafer and the polishing pad, wherein the slurry chemical is irradiated without substantially increasing a temperature of the polishing pad.

2. A chemical mechanical planarization (CMP) apparatus as recited in claim 1, wherein the radiation unit is one of an infrared (IR) lamp and an ultraviolet (UV) lamp.

3. A chemical mechanical planarization (CMP) apparatus as recited in claim 1, wherein the polishing pad is a belt-type pad and the slurry delivery location is defined upstream from a wafer application location, the radiation unit being located between the slurry delivery location and the wafer application location.

4. A chemical mechanical planarization (CMP) apparatus as recited in claim 1, wherein the polishing pad is a rotary-CMP pad and the slurry delivery location is defined upstream from a wafer application location, the radiation unit being located between the slurry delivery location and the wafer application location.

5. A chemical mechanical planarization (CMP) apparatus as recited in claim 3, wherein the radiation unit is a multi-segment unit, each segment of the multi-segment unit is configured to apply a different or same radiation level to the chemical slurry traveling on the belt-type pad.

6. A chemical mechanical planarization (CMP) apparatus as recited in claim 1, wherein the metal surface layer is one of copper and tungsten.

7. A method for enhancing the removal of a wafer layer of a wafer in chemical mechanical planarization (CMP) systems, the method comprising:

providing a polishing pad;

applying an amount of slurry onto a polishing pad; and applying radiation across a width of the polishing pad so as to irradiate an amount of slurry before the slurry is applied to the wafer layer.

8. The method of claim 7, further comprising:

providing a carrier head configured to hold the wafer; and creating a mechanical polishing interface between the polishing pad, the wafer layer, and a radiation exposed slurry by bringing the polishing pad and the carrier head into contact.

9. The method of claim 8, wherein the wafer layer is a metal surface layer.

10. A method of claim 9, wherein creating a mechanical polishing interface between the polishing pad, the wafer layer, and the slurry by bringing the polishing pad and the carrier head into contact, further includes:

applying the radiation exposed slurry onto the metal surface layer so as to create a top surface layer; and removing the top surface layer mechanically by bringing the top surface layer into contact with the polishing pad.

11. The method of claim 10, wherein the applying the radiation exposed slurry onto the metal surface layer so as to create a top surface layer, further includes:

changing the metal surface layer having a metallic bonding into the top surface layer having a molecular bonding.

12. The method of claim 10, wherein the applying the radiation exposed slurry onto the metal surface layer so as to create a top surface layer, further includes:

oxidizing the metal surface layer so as to create an oxidized metal surface layer.

13. The method of claim 12, wherein applying radiation exposed slurry on the metal surface layer is configured to increase a level of mechanical removal of the metal surface layer in response to an increase in a level of oxidation of the metal surface layer.

14. A chemical mechanical planarization (CMP) apparatus, comprising:

a belt polishing pad configured to receive a slurry chemical;

a carrier head configured to hold a wafer having a metal surface layer, the carrier head and the belt polishing pad are configured to mechanically interface during polishing of the metal surface layer with the slurry chemical; and a radiation unit configured to be applied over and across the belt polishing pad at a location after a slurry delivery location so as to expose the slurry chemical to radiation just prior to the mechanical interface between the metal surface layer of the wafer and the belt polishing pad.

* * * * *